United States Patent
Cole

(10) Patent No.: US 9,255,847 B1
(45) Date of Patent: *Feb. 9, 2016

(54) THERMO-OPTICAL ARRAY DEVICES AND METHODS OF PROCESSING THERMO-OPTICAL ARRAY DEVICES

(71) Applicant: Honeywell International Inc., Morristown, NJ (US)

(72) Inventor: Barrett E. Cole, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 5 days.

This patent is subject to a terminal disclaimer.

(21) Appl. No.: 14/606,534

(22) Filed: Jan. 27, 2015

Related U.S. Application Data

(63) Continuation of application No. 13/730,910, filed on Dec. 29, 2012, now Pat. No. 8,969,809.

(51) Int. Cl.
| | |
|---|---|
| *G01J 5/02* | (2006.01) |
| *G01J 5/20* | (2006.01) |
| *G01J 5/08* | (2006.01) |
| *H01L 31/18* | (2006.01) |
| *H04N 5/357* | (2011.01) |

(52) U.S. Cl.
CPC ............... *G01J 5/20* (2013.01); *G01J 5/0803* (2013.01); *H01L 31/18* (2013.01); *H04N 5/357* (2013.01)

(58) Field of Classification Search
CPC .................................. G01J 5/0803; G01J 5/20
USPC ..................................... 250/349, 338.4, 338.1
See application file for complete search history.

(56) References Cited

U.S. PATENT DOCUMENTS

| | | | |
|---|---|---|---|
| 5,801,383 A * | 9/1998 | Wada et al. .................. 250/332 |
| 6,489,613 B1 * | 12/2002 | Mori et al. ................ 250/338.1 |
| 6,595,427 B1 | 7/2003 | Soni et al. |
| 6,670,599 B2 | 12/2003 | Wagner et al. |
| 6,879,014 B2 | 4/2005 | Wagner et al. |
| 6,985,281 B2 | 1/2006 | Wagner et al. |
| 7,002,697 B2 | 2/2006 | Domash et al. |
| 7,049,004 B2 | 5/2006 | Domash et al. |
| 7,304,799 B2 | 12/2007 | Ma et al. |
| 7,402,803 B1 | 7/2008 | Wagner et al. |
| 7,491,060 B1 | 2/2009 | Ma |
| 7,522,328 B2 | 4/2009 | Wagner et al. |
| 7,697,192 B2 | 4/2010 | Wagner et al. |
| 7,829,854 B2 | 11/2010 | Wagner et al. |

(Continued)

OTHER PUBLICATIONS

"The New Light in Spectroscopy". REDSHIFT. OpTIC Optical Thermal Imaging Cameras. Date accessed: Apr. 7, 2014 from http://reshiftsystems.com/site/TechnologyProducts/Products/tabid/73/Defaulth.aspx.

*Primary Examiner* — Constantine Hannaher
*Assistant Examiner* — Meenakshi Sahu
(74) *Attorney, Agent, or Firm* — Brooks, Cameron & Huebsch, PLLC

(57) ABSTRACT

Thermo-optical array devices and methods of processing thermo-optical array devices are disclosed. One method of processing thermo-optical array devices includes forming a (001) oriented titanium dioxide material on a bolometer material, and forming a vanadium dioxide material on the (001) oriented titanium dioxide material. One thermo-optical array device includes a bolometer material, a titanium dioxide material on the bolometer material, and a vanadium dioxide material on the titanium dioxide material, wherein the vanadium dioxide material has an optical transition temperature of less than 67 degrees Celsius.

20 Claims, 2 Drawing Sheets

(56) References Cited

U.S. PATENT DOCUMENTS 8,969,809 B2 * 3/2015 Cole .............................. 250/349
2011/0300490 A1 * 12/2011 Rachet et al. ................. 430/322
2014/0183366 A1 * 7/2014 Cole .............................. 250/349

* cited by examiner

THERMO-OPTICAL ARRAY DEVICES AND METHODS OF PROCESSING THERMO-OPTICAL ARRAY DEVICES

CROSS REFERENCE TO RELATED APPLICATION

This application is a continuation of U.S. application Ser. No. 13/730,910, filed Dec. 29, 2012, the entire specification of which is incorporated herein by reference.

STATEMENT OF GOVERNMENT RIGHTS

The subject matter of this disclosure was made with government support under the Government Program Department of Interior/DARPA under Contract No.: D11PC20020. Accordingly, the U.S. Government has certain rights to subject matter disclosed herein.

TECHNICAL FIELD

The present disclosure relates to thermo-optical array devices and methods of processing thermo-optical array devices.

BACKGROUND

Un-cooled bolometer camera designs are very sophisticated, achieving high performance but at a high cost. Much of the cost of the camera is related to the cost of the array, the readout electronics, the addressing complementary metal oxide semiconductor (CMOS) in the array, the display electronics, and various other electronics systems. These features are all included to achieve high performance image, but at a high cost.

In such devices, infrared light from a target is imaged onto an array containing many pixels. This light, when illuminating a typical bolometer pixel, creates a change in the temperature of a "temperature sensing film" which can be fabricated in part from a vanadium oxide ($VO_x$) material, such as vanadium dioxide ($VO_2$).

Such a bolometer readout can be achieved by forming these pixels on top of CMOS electronics which can provide the row and column multiplexed addressing of a bias current which interrogates each pixel for a resistance change produced by the temperature increase caused by absorbed long wavelength infrared (LWIR) target radiation. The readout can be achieved via CMOS-bolometer integration.

The $VO_x$ material, however, may have an optical transition temperature (e.g., the temperature at which a change in the optical transmission of the $VO_2$ material occurs) of 67 degrees Celsius. Accordingly, such devices having bolometer pixels fabricated from only a $VO_2$ material (e.g., bolometer pixels that include only $VO_2$ material) may be inoperable or difficult to operate in ambient environments, such as environments having a temperature near 20 degrees Celsius (e.g., room temperature).

DETAILED DESCRIPTION

Thermo-optical array devices and methods of processing thermo-optical array devices are described herein. One or more method embodiments include forming an (001) oriented titanium dioxide material on a bolometer material, and forming a vanadium dioxide material on the (001) oriented titanium dioxide material. One or more device embodiments include a bolometer material, a titanium dioxide material on the bolometer material, and a vanadium dioxide material on the titanium dioxide material, wherein the vanadium dioxide material has an optical transition temperature of less than 67 degrees Celsius.

Thermo-optical array devices processed in accordance with one or more embodiments of the present disclosure may have an optical transition temperature of less than 67 degrees Celsius. For example, thermo-optical array devices processed in accordance with one or more embodiments of the present disclosure may have an optical transition temperature of 20 degrees Celsius (e.g., room temperature). Accordingly, thermo-optical array devices processed in accordance with one or more embodiments of the present disclosure may be operable in ambient environments.

Figure 1:
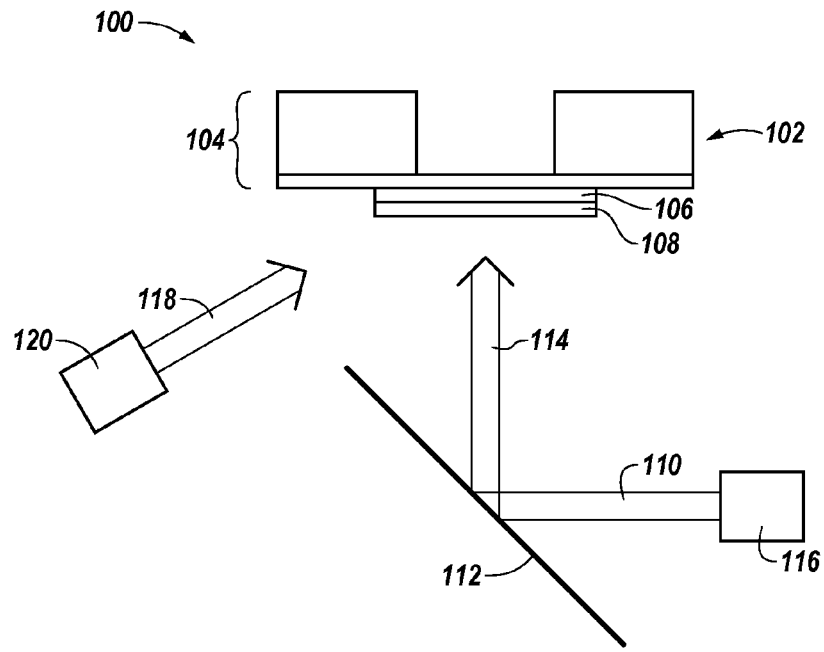
FIG. 1 illustrates a method of processing a thermo-optical array device in accordance with one or more embodiments of the present disclosure.

FIG. 1 illustrates a method 100 of processing a thermo-optical array device 102 (e.g., a pixel of thermo-optical array device 102) in accordance with one or more embodiments of the present disclosure. That is, method 100 can be used to process a plurality (e.g., array) of pixels of a thermo-optical array device, one pixel of which is illustrated in FIG. 1.

As shown in FIG. 1, a titanium dioxide ($TiO_2$) material 106 (e.g., a $TiO_2$ film) can be formed (e.g., grown) on a bolometer material 104 (e.g., a bolometer structure and/or support film) using a dual beam process (e.g., a process that includes two different ion beams and/or two different ion guns). $TiO_2$ material 106 can be an (001) oriented $TiO_2$ material (e.g., $TiO_2$ material 106 can have a planar orientation of (001)), as will be further described herein.

Bolometer material 104 can be, for example, an amorphous bolometer material (e.g., an amorphous bolometer support film). Further, bolometer material 104 can include an opening formed therein, and $TiO_2$ material 106 can be formed in line with (e.g., above or below) the opening, as illustrated in FIG. 1.

As shown in FIG. 1, the dual beam process can include applying ion beam 110 to a $TiO_2$ target material 112 such that $TiO_2$ atoms (represented in FIG. 1 by arrow 114) form on bolometer material 104. For example, ion beam 110 can be applied to $TiO_2$ target material 112 such that $TiO_2$ atoms are ejected from $TiO_2$ target material 112, and the ejected $TiO_2$ atoms can form on bolometer material 104. The $TiO_2$ atoms can form on bolometer material 104 at a 90 degree angle with respect to bolometer material 104, as represented by arrow 114.

Ion beam 110 can be an ion sputter beam (e.g., a primary ion sputter beam) provided by ion gun (e.g., plasma ion gun) 116. That is, ion beam 110 can be applied to $TiO_2$ target material 112 as part of a sputtering process (e.g., an ion beam sputtering process). For example, ions (e.g., 2 kV ions) from ion gun 116 can be aimed at $TiO_2$ target material 112 in an oxygen environment (e.g., in the presence of oxygen flow).

As shown in FIG. 1, the dual beam process can further include applying ion beam 118 to bolometer material 104. Ion beam 118 can be applied to bolometer material 104 at an angle of greater than 45 degrees with respect to bolometer material 104, as illustrated in FIG. 1. For example, ion beam 118 can be applied to bolometer material 104 at an angle of 57 degrees with respect to bolometer material 104. That is, ion beam 118 can be aimed at bolometer material 104 at a 57 degree angle with respect to bolometer material 104. However, embodiments of the present disclosure are not limited to a particular angle greater than 45 degrees with respect to bolometer material 104.

Ion beam 118 can be a low voltage ion beam (e.g., a secondary low voltage ion beam) provided by ion gun (e.g., plasma ion gun) 120. For example, low voltage ions (e.g., ions less than 2 kV) from ion gun 120 can be aimed at bolometer material 104 at an angle of greater than 45 degrees with respect to bolometer material 104.

As shown in FIG. 1, ion beam 118 can be applied to bolometer material 104 at the same time as ion beam 110 is being applied to $TiO_2$ target material 112. That is, ion beam 118 can be applied to $TiO_2$ material 106 while $TiO_2$ material 106 is being formed on bolometer material 104 (e.g., ion beam 118 can be applied to bolometer material 104 while the $TiO_2$ atoms are being formed on bolometer material 104), as illustrated in FIG. 1.

Applying ion beam 118 to bolometer material 104 (e.g., to $TiO_2$ material 106 while $TiO_2$ material 106 is being formed on bolometer material 104) at an angle of greater than 45 degrees (e.g., 57 degrees) with respect to bolometer material 104 can orient $TiO_2$ material 106 (e.g., the $TiO_2$ atoms). For example, applying ion beam 118 to bolometer material 104 at such an angle can orient $TiO_2$ material 106 such that $TiO_2$ material is an (001) oriented $TiO_2$ material (e.g., such that $TiO_2$ material 106 has a planar orientation of (001)). Further, applying ion beam 118 to bolometer material 104 at such an angle can orient $TiO_2$ material 106 such that $TiO_2$ material 106 has lattice constants of a=b=4.59 and c=2.95. Further, applying ion beam 118 to bolometer material 104 at such an angle can orient $TiO_2$ material 106 such that $TiO_2$ material 106 has a tetragonal rutile structure.

As shown in FIG. 1, a vanadium dioxide ($VO_2$) material 108 (e.g., a $VO_2$ film) can be formed (e.g., grown and/or deposited) on $TiO_2$ material 106. For example, $VO_2$ material 108 can be formed on $TiO_2$ material 106 after $TiO_2$ material 106 is formed on bolometer material 104. That is, $VO_2$ material 108 can be formed on $TiO_2$ material 106 after $TiO_2$ material 106 has been oriented in the manner described above.

Because $VO_2$ material 108 is formed on the oriented $TiO_2$ material 106, $VO_2$ material 108 can have an optical transition temperature of less than 67 degrees Celsius. For example, $VO_2$ material 108 can have an optical transition temperature of approximately 20 degrees Celsius (e.g., room temperature). Accordingly, thermo-optical array device 102 may be operable in ambient environments, such as environments having a temperature near 20 degrees Celsius.

In contrast, if $VO_2$ material 108 was formed on bolometer structure 104 without the presence of the oriented $TiO_2$ material 106 (e.g., without using the dual beam process described above), $VO_2$ material 108 would have an optical transition temperature of 67 degrees Celsius. That is, if thermo-optical array device 102 included only $VO_2$ material 108 on bolometer material 104 (e.g., if thermo-optical array device 102 did not also include the oriented $TiO_2$ material 106), $VO_2$ material 108 would have an optical transition temperature of 67 degrees Celsius. In such a situation, thermo-optical array device 102 may be inoperable or difficult to operate in ambient environments.

As used herein, the optical transition temperature of a $VO_x$ material (e.g., $VO_2$ material 108) can refer to the temperature at which a change (e.g., decrease) in the optical transmission of the $VO_x$ material occurs. That is, the optical transition temperature of a $VO_x$ material (e.g., $VO_2$ material 108) can refer to the temperature at which the amount (e.g., percentage) of radiation (e.g., LWIR light) transmitted by (e.g., passing through) the $VO_x$ material changes (e.g., decreases from a high percentage to a low percentage).

Although not illustrated in FIG. 1 for clarity and so as not to obscure embodiments of the present disclosure, $VO_2$ material 108 can be formed on $TiO_2$ material 106 by applying an ion beam to a $VO_2$ target material such that $VO_2$ atoms form on $TiO_2$ material 106. For example, the ion beam can be applied to the $VO_2$ target material such that $VO_2$ atoms are ejected from the $VO_2$ target material, and the ejected $VO_2$ atoms can form on $TiO_2$ material 106.

The ion beam can be an ion sputter beam provided by an ion gun (e.g., a plasma ion gun). That is, the ion beam can be applied to the $VO_2$ target material as part of a sputtering process (e.g., an ion beam sputtering process). For example, ions (e.g., 2 kV ions) from the ion gun can be aimed at the $VO_2$ target material in an oxygen environment (e.g., in the presence of oxygen flow).

Figure 2:
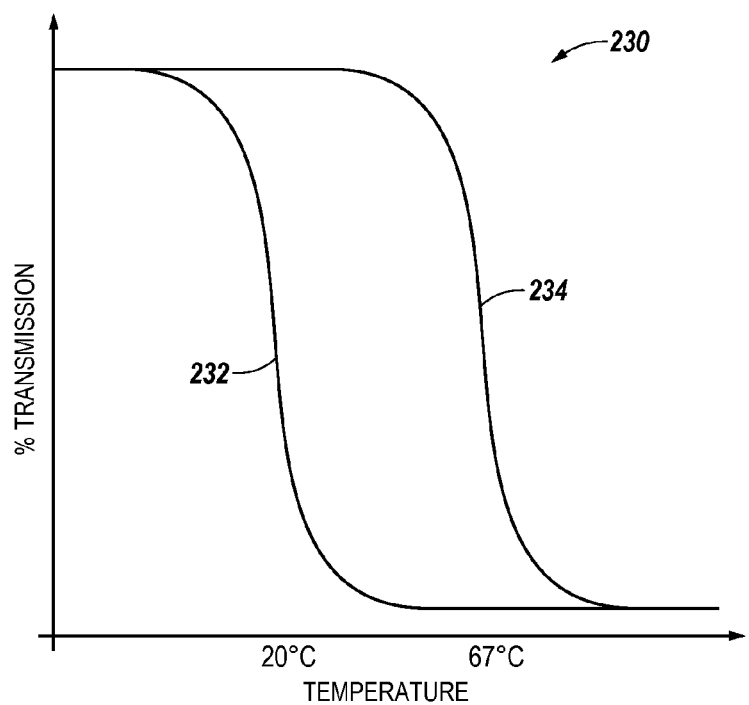
FIG. 2 illustrates a graphical representation of the optical transmission curves for a thermo-optical array device processed in accordance with one or more embodiments of the present disclosure and a thermo-optical array device not processed in accordance with one or more embodiments of the present disclosure.

FIG. 2 illustrates a graphical representation 230 of the optical transmission curves for a thermo-optical array device processed in accordance with one or more embodiments of the present disclosure (e.g., thermo-optical array device 102 previously described in connection with FIG. 1) and a thermo-optical array device not processed in accordance with one or more embodiments of the present disclosure (e.g., a thermo-optical array device including only a $VO_x$ material formed on a bolometer structure). Optical transmission curve 232 is the optical transmission curve for thermo-optical array device 102, and optical transmission curve 234 is the optical transmission curve for the thermo-optical array device not processed in accordance with one or more embodiments of the present disclosure.

As shown in FIG. 2, thermo-optical array device 102 has an optical transition temperature (e.g., the temperature at which the optical transmission percentage of the thermo-optical array device transitions from high to low) of approximately 20 degrees Celsius (e.g., room temperature). Accordingly, thermo-optical array device 102 may be operable in ambient environments, such as environments having a temperature near 20 degrees Celsius.

In contrast, the thermo-optical array device not processed in accordance with one or more embodiments of the present disclosure has an optical transition temperature of approximately 67 degrees Celsius, as illustrated in FIG. 2. Accordingly, the thermo-optical array device not processed in accordance with one or more embodiments of the present disclosure may be inoperable or difficult to operate in ambient environments.

Figure 3:
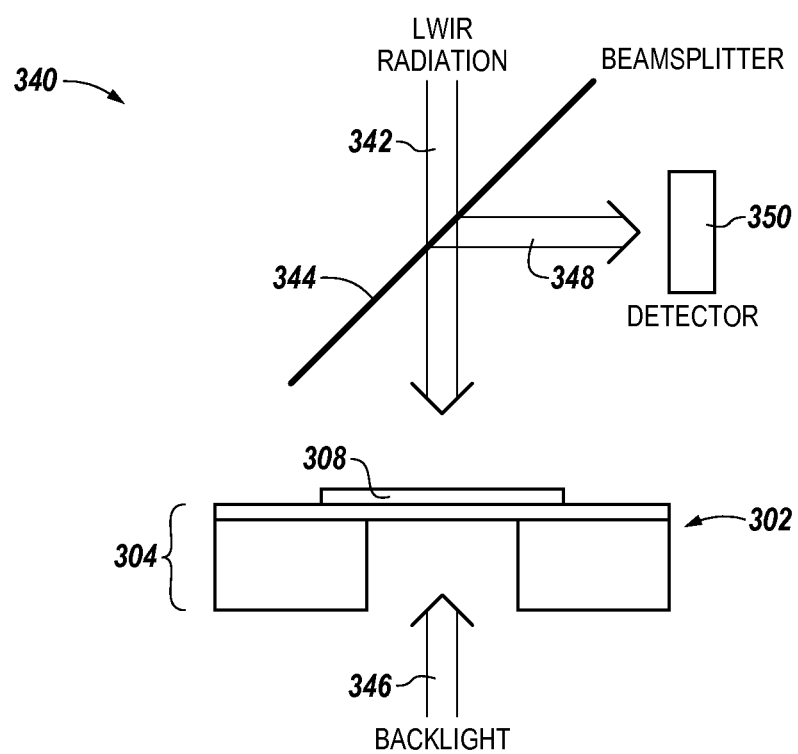
FIG. 3 illustrates a portion of an infrared imager having a thermo-optical array device processed in accordance with one or more embodiments of the present disclosure.

FIG. 3 illustrates a portion of an infrared imager 340 having a thermo-optical array device 302 processed in accordance with one or more embodiments of the present disclosure. Thermo-optical array device 302 can be, for example, thermo-optical array device 102 previously described in connection with FIG. 1. That is, thermo-optical array device 302 can include a $TiO_2$ material (not shown in FIG. 3) formed on a bolometer material 304 and a $VO_2$ material 308 formed on the $TiO_2$ material in a manner analogous to that previously described in connection with FIG. 1. Further, thermo-optical array device 302 can include a plurality (e.g., array) of pixels, one pixel of which is illustrated in FIG. 3.

VO$_2$ material 308 can transition from transparent to opaque with respect to light in response to temperature changes. In some embodiments, VO$_2$ material 308 does not transition between totally transparent or opaque to a desired wavelength range of light, but rather varies in the amount of light transmitted through it. By focusing infrared (IR) light, such as long wavelength infrared (LWIR) light, on VO$_2$ material 308, the transitions may be representative of an image of an object generating the IR light, as will be further described herein. For instance, IR light striking VO$_2$ material 308 that is in the transition region will heat up VO$_2$ material 308 depending on the intensity of light coming from the object. The absorbed heat from the IR light causes the reflectance and transmission of VO$_2$ material 308 to change in a desired wavelength range of light in response to the level of IR power received.

As shown in FIG. 3, infrared imager 340 includes a beamsplitter 344. Beamsplitter 344 can be, for example, a dichroic beamsplitter. Beamsplitter 344 can receive short wavelength infrared (SWIR) radiation (e.g., infrared light having a wavelength of 0.75 micrometers to 1.4 micrometers) and/or long wavelength infrared (LWIR) radiation (e.g., infrared light having a wavelength of 8 micrometers to 15 micrometers) from, for example, a lens (e.g., a chalcogenide lens; not shown in FIG. 3), and refract the LWIR radiation (e.g., LWIR radiation 342) onto thermo-optical array device 302 (e.g., VO$_2$ material 308), as illustrated in FIG. 3. That is, VO$_2$ material 308 can receive LWIR radiation 342 from beamsplitter 344, as illustrated in FIG. 3.

Further, as shown in FIG. 3, VO$_2$ material 308 can receive, and modulate, light 346 from a backlight positioned below thermo-optical array device 302. Light 346 can be, for example, 1.5 micrometer LED light (e.g., the backlight can be a 1.5 micrometer LED backlight). VO$_2$ material 308 can receive light 346 via (e.g., through) the opening in bolometer material 304, as illustrated in FIG. 3. For example, light 346 can be collimated (e.g., via one or more lenses; not shown in FIG. 3) to illuminate VO$_2$ material 308.

As shown in FIG. 3, infrared imager 340 includes a detector 350. Detector 350 can be, for example, a CMOS charge coupled device (CCD) such as a Germanium (Ge)-CMOS detector (e.g., array). VO$_2$ material 308 can measure the flux of LWIR radiation 342, and transmit wavelength radiation (e.g., SWIR radiation) 348 corresponding to the measured flux of LWIR radiation 342 to detector 350 via beamsplitter 344. For example, wavelength radiation 348 can be transmitted utilizing light 346 from the backlight (e.g., light 346 can pass through VO$_2$ material 308, through beamsplitter 344, and be imaged onto detector 350). That is, the backlight can be the source of radiation to detector 350 that is modulated by the temperature of VO$_2$ material 308.

Detector 350 can then provide an image of the object that generated the SWIR radiation and/or LWIR radiation 342 received by beamsplitter 344 based on the received wavelength radiation 348. For example, detector 350 can convert the received wavelength radiation 348 to an electronic output (e.g., signal) which can be transmitted to a display device (not shown in FIG. 3) and used to create an image of the object. For instance, detector 340 can analyze the received wavelength radiation 348 and provide a viewable image on a display for a user to view.

The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 101 may reference element "02" in FIG. 1, and a similar element may be referenced as 302 in FIG. 3.

As used herein, "a" or "a number of" something can refer to one or more such things. For example, "a number of devices" can refer to one or more devices.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of processing a thermo-optical array device, comprising:
    forming a titanium dioxide material on a bolometer material; and
    forming a vanadium dioxide material on the titanium dioxide material.

2. The method of claim 1, wherein the method includes forming the titanium dioxide material on the bolometer material using a process that includes two different ion beams or two different ion guns.

3. The method of claim 1, wherein forming the titanium dioxide material on the bolometer material includes applying an ion beam to a titanium dioxide target material such that titanium dioxide atoms form on the bolometer material.

4. The method of claim 1, wherein forming the titanium dioxide material on the bolometer material includes applying an ion beam to the bolometer material to orient the titanium dioxide material.

5. The method of claim 4, wherein forming the titanium dioxide material on the bolometer material includes applying the ion beam to the bolometer material at an angle of greater than 45 degrees with respect to the bolometer material.

6. The method of claim 1, wherein forming the vanadium dioxide material on the titanium dioxide material includes applying an ion beam to a vanadium dioxide target material such that vanadium dioxide atoms form on the titanium dioxide material.

7. A thermo-optical array device, comprising:
a titanium dioxide material on a bolometer material; and
a vanadium dioxide material on the titanium dioxide material.

8. The device of claim 7, wherein the titanium dioxide material is a (001) oriented titanium dioxide material.

9. The device of claim 7, wherein the vanadium dioxide material has an optical transition temperature of less than 67 degrees Celsius.

10. The device of claim 7, wherein the device is operable in an ambient environment.

11. The device of claim 7, wherein the vanadium dioxide material is configured to transition from transparent to opaque with respect to light in response to a change in temperature.

12. An infrared imager, comprising:
a thermo-optical array device having a number of pixels, wherein each of the number of pixels includes:
a titanium dioxide material on a bolometer material; and
a vanadium dioxide material on the titanium dioxide material.

13. The infrared imager of claim 12, wherein the titanium dioxide material has a planar orientation of (001).

14. The infrared imager of claim 12, wherein the infrared imager includes a beamsplitter configured to refract long wavelength infrared radiation onto the vanadium dioxide material of each of the number of pixels.

15. The infrared imager of claim 14, wherein the beamsplitter is a dichroic beamsplitter.

16. The infrared imager of claim 12, wherein the infrared imager includes a backlight configured to provide light to the vanadium dioxide material of each of the number of pixels.

17. The infrared imager of claim 16, wherein the backlight is configured to provide the light to the vanadium dioxide material of each of the number of pixels via an opening in the bolometer material of each of the number of pixels.

18. The infrared imager of claim 12, wherein:
the infrared imager includes a detector; and
the vanadium dioxide material of each of the number of pixels is configured to:
measure a flux of long wavelength infrared radiation; and
transmit wavelength radiation corresponding to the measured flux to the detector.

19. The infrared imager of claim 18, wherein the detector is a complementary metal oxide semiconductor (CMOS) charge coupled device.

20. The infrared imager of claim 18, wherein the detector is configured to:
convert the wavelength radiation to an electronic output; and
transmit the electronic output to a display device.

* * * * *